US009780287B2

(12) United States Patent
Weston et al.

(10) Patent No.: US 9,780,287 B2
(45) Date of Patent: Oct. 3, 2017

(54) ONE UP, ONE DOWN CONNECTION STRUCTURE FOR PIEZOELECTRIC DEVICE IN TIRE PATCH

(71) Applicants: COMPAGNIE GENERALE DES ETABLISSEMENTS MICHELIN, Clermont-Ferrand (FR); MICHELIN RECHERCHE et TECHNIQUE S.A., Granges-Paccot (CH)

(72) Inventors: David Alan Weston, Greenville, SC (US); Raymond Leslie Hodgkinson, Piedmont, SC (US)

(73) Assignee: COMPAGNIE GENERALE DES ETABLISSEMENTS MICHELIN, Clermont-Ferrand (FR)

( * ) Notice: Subject to any disclaimer, the term of this patent is extended or adjusted under 35 U.S.C. 154(b) by 389 days.

(21) Appl. No.: 14/417,346

(22) PCT Filed: Nov. 15, 2012

(86) PCT No.: PCT/US2012/065259
§ 371 (c)(1),
(2) Date: Jan. 26, 2015

(87) PCT Pub. No.: WO2014/077816
PCT Pub. Date: May 22, 2014

(65) Prior Publication Data
US 2015/0249198 A1  Sep. 3, 2015

(51) Int. Cl.
*H01L 41/047* (2006.01)
*H01L 41/22* (2013.01)
(Continued)

(52) U.S. Cl.
CPC .......... *H01L 41/047* (2013.01); *B23K 1/0016* (2013.01); *B23K 31/02* (2013.01);
(Continued)

(58) Field of Classification Search
CPC ....... H01L 41/0477; H01L 41/22; H05K 1/18; H05K 5/34
(Continued)

(56) References Cited

U.S. PATENT DOCUMENTS 6,546,982 B1  4/2003  Brown
8,525,658 B2  9/2013  Hirabayashi et al.
(Continued)

FOREIGN PATENT DOCUMENTS

JP  2005331070  12/2005
JP  2005331070 A * 12/2005  .............. F16F 15/02
WO  WO-2005024966 A1 * 3/2005  .............. B06B 1/06

OTHER PUBLICATIONS

PCT International Search Report for PCT72012/065259, dated Jan. 31, 2013.

*Primary Examiner* — Thomas Dougherty
(74) *Attorney, Agent, or Firm* — Dority & Manning, P.A.

(57) ABSTRACT

A conductive terminal structure for a piezoelectric device used as part of a tire mountable apparatus is provided. Unlike known electrical connection structures which include a plurality of conductive terminals that are all exposed through a single insulating layer of the piezoelectric device, such as a top layer of the piezoelectric device, the electrical connection structure can be arranged in a one up, one down configuration. In this configuration, at least one conductive terminal is exposed through a top insulating layer of the piezoelectric device. In addition, at least one conductive terminal of a piezoelectric component is exposed through a bottom insulating layer of the piezoelectric device. The electrical connection structure can be used in combination with a connector assembly design to preserve the integrity of the electrical connection between the electrical and mechanical connection structure and a printed circuit board.

20 Claims, 5 Drawing Sheets

(51) Int. Cl.

| | | |
|---|---|---|
| | *H01L 41/053* | (2006.01) |
| | *B60C 23/04* | (2006.01) |
| | *B23K 1/00* | (2006.01) |
| | *B23K 31/02* | (2006.01) |
| | *B29C 73/10* | (2006.01) |
| | *B60C 19/00* | (2006.01) |
| | *B60C 99/00* | (2006.01) |
| | *H05K 1/18* | (2006.01) |
| | *H05K 3/34* | (2006.01) |
| | *B29L 30/00* | (2006.01) |
| | *H01L 41/293* | (2013.01) |
| | *H01L 41/313* | (2013.01) |

(52) U.S. Cl.
CPC .............. *B29C 73/10* (2013.01); *B60C 19/00* (2013.01); *B60C 23/0411* (2013.01); *B60C 23/0493* (2013.01); *B60C 99/00* (2013.01); *H05K 1/18* (2013.01); *H05K 3/34* (2013.01); *B29L 2030/00* (2013.01); *H01L 41/293* (2013.01); *H01L 41/313* (2013.01); *H05K 2203/04* (2013.01); *H05K 2203/1194* (2013.01); *Y10T 29/42* (2015.01)

(58) Field of Classification Search
USPC .................. 310/311–371, 40, 344, 365, 366; 29/25.35
See application file for complete search history.

(56) References Cited

U.S. PATENT DOCUMENTS

| | | | | |
|---|---|---|---|---|
| 8,546,998 | B2* | 10/2013 | Weston | ................ H01L 41/047 310/328 |
| 8,742,265 | B2* | 6/2014 | Weston | ............... B60C 23/0411 174/260 |
| 2005/0076982 | A1 | 4/2005 | Metcalf | |
| 2011/0084574 | A1 | 4/2011 | Weston | |
| 2011/0132649 | A1 | 6/2011 | Weston | |
| 2011/0140581 | A1 | 6/2011 | Weston | |
| 2012/0043856 | A1 | 2/2012 | Kameda et al. | |
| 2013/0334927 | A1* | 12/2013 | Fujimoto | ............ H02N 2/0085 310/314 |

\* cited by examiner

ONE UP, ONE DOWN CONNECTION STRUCTURE FOR PIEZOELECTRIC DEVICE IN TIRE PATCH

FIELD OF THE INVENTION

The present disclosure relates generally to a piezoelectric device for use as part of a tire patch, and more particularly to an electrical connection structure for a piezoelectric device used as part of a tire patch.

BACKGROUND OF THE INVENTION

The incorporation of electronic devices with tire structures has been shown to yield many practical advantages. Piezoelectric devices have been incorporated with tire patches to provide a power source to various sensors and other components of a tire patch used to measure tire parameters. Piezoelectric devices have also been used to acquire data about various physical parameters of a tire during rotation of the tire. Such information may be useful in tire monitoring and warning systems as well as in tire testing and design.

One known structure for a piezoelectric device includes a substrate having one or more piezoelectric components, such as a power generation component and a signal generation component. Each piezoelectric component can include a sandwich structure that includes a top conductive layer and a lower conductive layer that sandwich a piezoelectric layer. The substrate can include various insulating layers, such as a top insulating layer and a bottom insulating layer to protect and insulate the piezoelectric components. The various piezoelectric components of the piezoelectric device can be electrically coupled to an external device, such as a printed circuit board, using conductive terminals.

In typical connections for the piezoelectric device, the conductive terminals for the piezoelectric components of the substrate are all located proximate to and are exposed to a single surface of the substrate, such as a top surface of the piezoelectric substrate. In these connections, an electrical connection is made between the conductive terminal located proximate to the top surface of the piezoelectric substrate and a lower conductive layer using a compression connection. This compression connection involves bringing a conductor proximate the top conductive layer in communication with the conductive terminal and a conductor in communication with the lower conductive layer using locally applied high pressure compression techniques to create electrical contact between the conductive terminal and the lower conductive layer.

For example, FIG. 1 depicts an exemplary piezoelectric device 10 having a known connection structure 30. As shown, the connection structure 30 includes a plurality of conductive terminals 32, 34, 36, 38. Each of the conductive terminals 32, 34, 36, and 38 is exposed to the same surface of the piezoelectric device 10 through the same insulating layer 40 of piezoelectric device 10. Certain of the conductive terminals 34 and 36 are coupled to piezoelectric components in the piezoelectric device 10 through compression connections 50. The compression connections 50 require a conductor disposed in one layer of the piezoelectric device 10 to be brought into contact with a conductor disposed in another layer of the piezoelectric device 10 through high pressure compression. As depicted, the space required for compression connections 50 can take up valuable real estate on the piezoelectric device 10.

Given the strain that a piezoelectric device can be subjected to during rotation of a tire, a compression connection coupling a conductive terminal to a lower conductive layer in a piezoelectric device can be disrupted or can fail during use of the piezoelectric device. In addition, in many applications, a relatively rigid material, such as FR4, is used for the insulating layers of the substrate. It can be difficult to create workable compression connections through these rigid insulating layers using locally applied high pressure compression techniques.

Thus, a need exists for an improved electrical connection structure for a piezoelectric device. A connection structure that readily allows for incorporation of the piezoelectric device into a tire patch would be particularly useful.

SUMMARY OF THE INVENTION

Aspects and advantages of the invention will be set forth in part in the following description, or may be apparent from the description, or may be learned through practice of the invention.

One exemplary aspect of the present disclosure is directed to a tire mountable apparatus. The tire mountable apparatus includes a substrate that has a piezoelectric component. The piezoelectric component includes first and second conductive layers and a piezoelectric layer arranged between the first and second conductive layers. The substrate further includes a first insulating layer disposed on the first conductive layer and a second insulating layer disposed on the second conductive layer such that the piezoelectric component is arranged between the first insulating layer and the second insulating layer in the substrate. The substrate further includes a conductive terminal structure. The conductive terminal structure includes a plurality of conductive terminals, including a first conductive terminal electrically coupled to the first conductive layer and a second conductive terminal electrically coupled to the second conductive layer. The first conductive terminal is exposed through the first insulating layer of the substrate and the second conductive terminal is exposed through the second insulating layer of the substrate.

Another exemplary aspect of the present disclosure is directed to a method of manufacturing a tire mountable apparatus. The method includes aligning a first support bar with a plurality of conductive terminals formed in a substrate, the substrate comprising a piezoelectric component arranged between a first insulating layer and a second insulating layer. The plurality of conductive terminals include a first conductive terminal exposed through the first insulating layer of the substrate and a second conductive terminal exposed through the second insulating layer of the substrate. The method further includes providing solder in a second solder well formed in the second insulating layer of the substrate. The second solder well is associated with the second conductive terminal. The method further includes soldering an electrical connector located in the first support bar with the second conductive terminal.

In a particular implementation of this exemplary aspect of the present disclosure, the method can further include providing solder in a first solder well formed in the first insulating layer of the substrate. The first solder well can be associated with the first conductive terminal. The method can further include soldering an electrical connector with the first conductive terminal.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
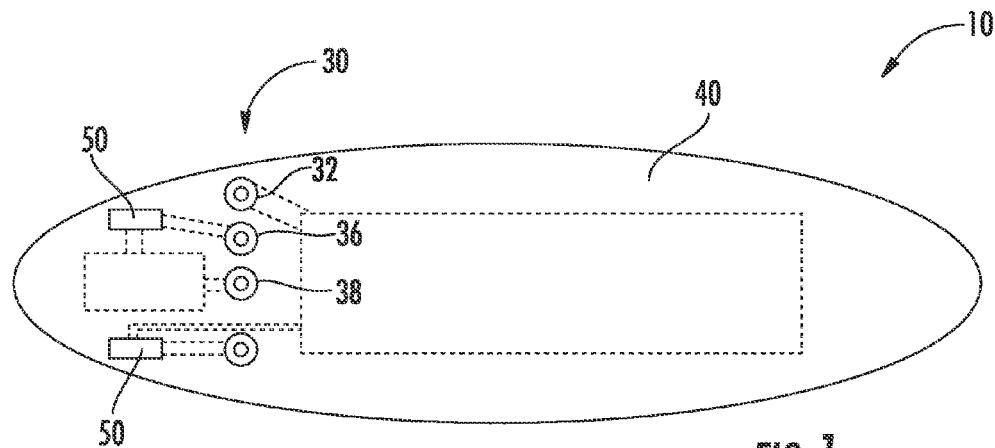
FIG. 1 depicts a plan view of a piezoelectric device having a known connection structure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to an improved conductive terminal structure for a piezoelectric device used as part of a tire mountable apparatus, such as a tire patch that can be incorporated with a tire to measure various parameters of the tire. In particular, a piezoelectric device can include one or more piezoelectric components that are used to harvest energy and/or to provide signals indicative of tire rotation/strain. The piezoelectric components can have a sandwich structure that includes a piezoelectric layer, such as a lead zirconate titanate (PZT) layer, arranged between a pair of conductive layers. The piezoelectric components can be arranged between a pair of insulating layers, such as FR4 layers. The piezoelectric device can be implemented as a substrate or can take any other suitable form, such as a film. An electrical connection structure can be provided in the piezoelectric device to electrically connect the piezoelectric components to a printed circuit board or other device used as part of the tire patch. The piezoelectric components can provide energy and/or signals through the electrical connection structure to various devices located on the printed circuit board.

Unlike known electrical connection structures which include a plurality of conductive terminals that are all exposed through a single insulating layer of the substrate, such as a top layer of the substrate, the electrical connection structure according to aspects of the present disclosure are arranged in a one up, one down configuration. In this configuration, at least one conductive terminal that is electrically coupled to a top conductive layer of a piezoelectric component is exposed through a top insulating layer of the substrate. In addition, at least one conductive terminal that is electrically coupled to a bottom conductive layer of a piezoelectric component is exposed through a bottom insulating layer of the substrate. As a result, at least one pair of conductive terminals of the electrical connection structure are exposed for electrical connection through opposite surfaces of the substrate such that there is at least one "up" conductive terminal and one "down" conductive terminal.

The one up, one down electrical connection structure according to aspects of the present disclosure eliminates the need for compression connections to electrically couple conductive terminals with conductive layers of a piezoelectric component. Elimination of compression connections provides many advantages. For instance, elimination of compression connections improves the durability of the electrical connections between the piezoelectric components and the printed circuit board, leading to increased reliability and performance life of the tire patch. Moreover, a relatively rigid material, such as FR4 material, can be used as the insulating layers of the substrate without affecting the quality of electrical connections within the substrate.

According to particular aspects of the present disclosure, the one up, one down electrical connection structure can be used in combination with a connector assembly design to preserve the integrity of the electrical connection between the electrical connection structure and the printed circuit board. For instance, the electrical connection structure can be arranged between a first support bar and a second support bar. An electrical connector disposed in the first support bar can be soldered to a "down" conductive terminal exposed through the layer of insulating material adjacent to the first support bar. Similarly, an electrical connector can be soldered to an "up" conductive terminal exposed through the layer of insulating material adjacent the second support bar. The printed circuit board can be electrically and mechanically coupled to the electrical connection structure using conductive posts, such as threaded rods, that can be used to compress the connection structure between the first and second support bars. As a result, the electrical interface between the printed circuit board and the electrical connection structure can be chemically and electrically preserved using ordinary solder and a compressive load.

Figure 2:
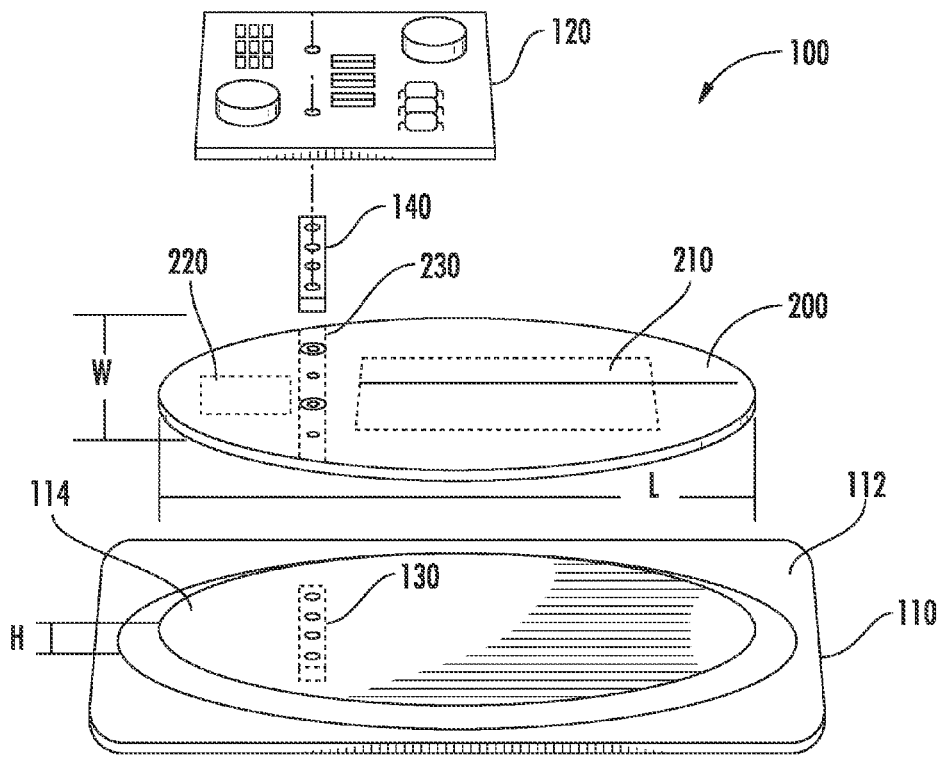
FIG. 2 depicts an exploded view of an exemplary tire mountable apparatus according to an exemplary embodiment of the present disclosure.

Referring now to the FIGS., exemplary embodiments of the present disclosure will now be discussed in detail. FIG. 2 depicts an exploded view of an exemplary tire mountable apparatus 100 (e.g. a tire patch) according to an exemplary embodiment of the present disclosure. The tire mountable apparatus 100 can be secured to a tire, such as the inner liner of a pneumatic tire, to monitor various parameters of the tire.

As illustrated, the tire mountable apparatus 100 includes a substrate 200 having a length L and a width W. As illustrated, the width W of the substrate 200 is significantly less than the length L. For instance, the length L can be at least twice the width W. In this regard, the tire mountable apparatus can be considered a 1-D tire mountable apparatus 100 because the length L dimension is significantly larger than the width W dimension. As can be seen from FIG. 2, however, the 1-D tire mountable apparatus 100 actually has three dimensions.

The substrate 200 can be secured to an elastomeric patch 110 that includes a base portion 112 and a raised mesa portion 114 having a height H above the base portion 112 of the elastomeric patch 110. The elastomeric patch 110 can be formed from an elastomeric material, such as a rubber material normally employed as a sidewall material in the construction of pneumatic tires. In one example, the substrate 200 can be secured to the elastomeric patch 110 by coating an adhesive on the substrate 200, placing the substrate 200 in a specially designed mold designed to accommodate the substrate 200, filling the remainder of the mold with the elastomeric material, and curing the patch 110.

As illustrated in FIG. 2, the substrate 200 includes a first piezoelectric component 210 and a second piezoelectric component 220. The first piezoelectric component 210 can be a generator piezoelectric component that is used to harvest energy upon flexure of the first piezoelectric component 210. The second piezoelectric component 220 can be a signal/sensor piezoelectric component that is used to provide electrical signals for analysis upon flexure of the second piezoelectric component 220. The electrical signals provided by the second piezoelectric component 220 can be analyzed, for instance, to determine characteristics of the contact patch of a tire or to count revolutions of a tire.

Figure 3:
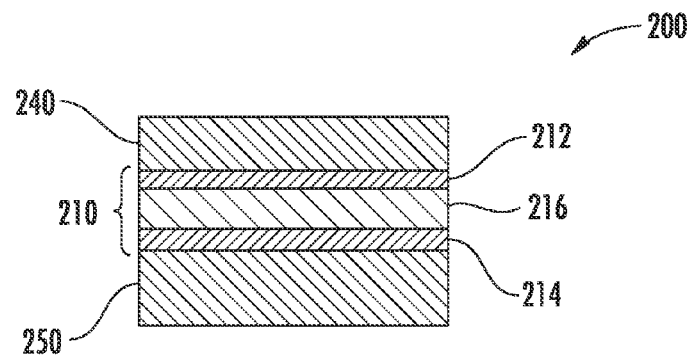
FIG. 3 depicts a cross-sectional view of a substrate including a piezoelectric component according to an exemplary embodiment of the present disclosure.

Each of the piezoelectric components 210 and 220 can include a sandwich structure that includes a piezoelectric layer arranged between two conductive layers. FIG. 3 depicts a cross-sectional view of the piezoelectric component 210 of substrate 200. The piezoelectric component 210 includes a piezoelectric layer 216 arranged between a first conductive layer 212 on a first side of the piezoelectric layer 216 and a second conductive layer 214 on a second side of the piezoelectric layer 216. The piezoelectric layer 216 can be formed from any suitable piezoelectric material, such as a PZT material. The conductive layers 212 and 214 can be formed from any suitable conductive material, such as copper.

As illustrated in FIG. 3, the piezoelectric component 210 is arranged between a first insulating layer 240 of the substrate 200 and a second insulating layer 250 of the substrate 200. Due to the strain the substrate 200 is subjected to during rotation of the tire, the first insulating layer 240 and the second insulating layer 250 can be formed from a relatively rigid material, such as the fire resistant material FR4 or other suitable materials. In one aspect, the second insulating layer 250 can be thicker than the insulating layer 240 to offset the piezoelectric layer 216 from a neutral plane off the substrate 200 to increase energy generation upon flexure of the piezoelectric component 210.

Referring back to FIG. 2, the tire mountable apparatus 100 can further include a printed circuit board 120. The printed circuit board 120 can include various components and devices, such as a microprocessor, a memory, temperature and/or pressure sensors, filter circuits, communication circuits, a battery, one or more antennas for communicating information to remote devices, and other devices. The generator piezoelectric component 210 can provide energy upon flexure of the piezoelectric component 210 to power the various components of the printed circuit board 120. The signal piezoelectric component 220 can provide signals associated with strain induced in a tire upon flexure of the piezoelectric component 220 to the printed circuit board for analysis.

As will be discussed in more detail below, the printed circuit board 120 can be electrically coupled to the generator piezoelectric component 210 and the signal piezoelectric component 220 of the substrate through a one up, one down electrical connection structure 230. The connection structure 230 can include a plurality of conductive terminals. While four conductive terminals are depicted in FIG. 2, those of ordinary skill in the art, using the disclosures provided herein, will understand that more or fewer conductive terminals can be provided without deviating from the scope of the present disclosure.

As shown in FIG. 2, the plurality of conductive terminals can be arranged in a generally linear relationship. It should be appreciated that as used herein, the phrase "generally linear relationship" is intended to signify that there may be a variation in alignment from a perfect linear relationship. The conductive terminals can be arranged along a line perpendicular to the length of the substrate 200 such that mechanical strain applied to the conductive terminals during use can be reduced.

The one up, one down connection structure 230 arranges the plurality of conductive terminals such that at least one conductive terminal is exposed through a top surface of the substrate 200 and at least one other conductive terminal is exposed through a bottom surface of the substrate 200. The connection structure 230 can be arranged between a first support bar 130 and a second support bar 140 which can be used to provide a compressive load to the connection structure 230. This compressive load can be used to ensure the chemical and electrical integrity of the electrical connection between the printed circuit board 140 and the electrical connection structure 230 using ordinary solder connections as will be discussed in more detail below.

Figure 4:
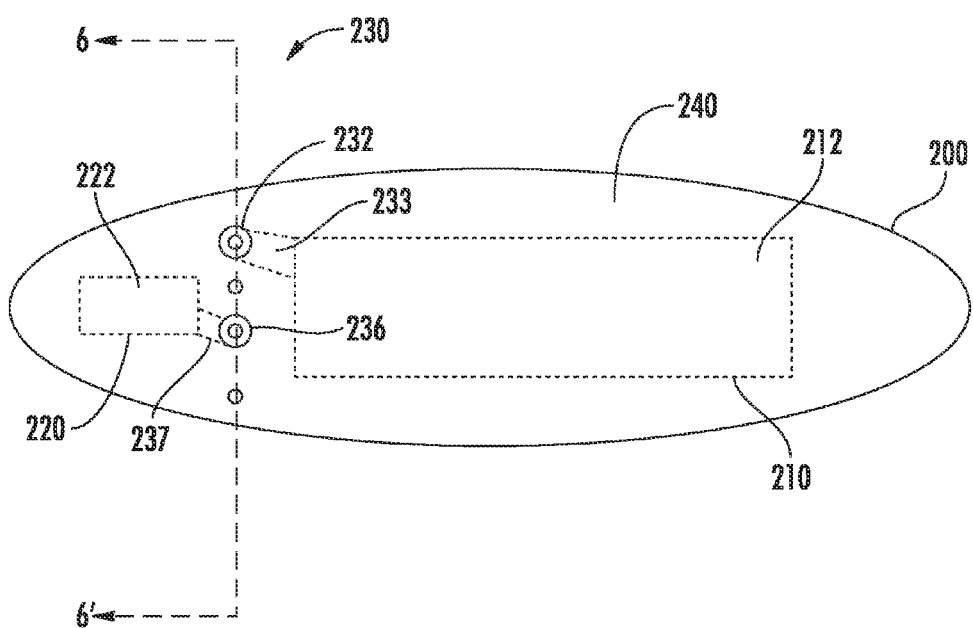
FIG. 4 depicts a plan view of a first surface of a substrate including a conductive terminal structure according to an exemplary embodiment of the present disclosure.

Exemplary aspects of the one up, one down connection structure 230 will be discussed with reference to FIGS. 4-6. FIG. 4 depicts a top plan view of the substrate 200 including a one up, one down connection structure 230 according to an exemplary embodiment of the present disclosure. The connection structure 230 includes a first conductive terminal 232 electrically coupled to the first conductive layer 212 of the piezoelectric component 210 via a suitable conductive trace 233. The first conductive terminal 232 includes a conductive annulus or other suitable conductive structure that is exposed to the top surface of the substrate 200 through the first insulating layer 240 of the substrate 200.

Figure 5:
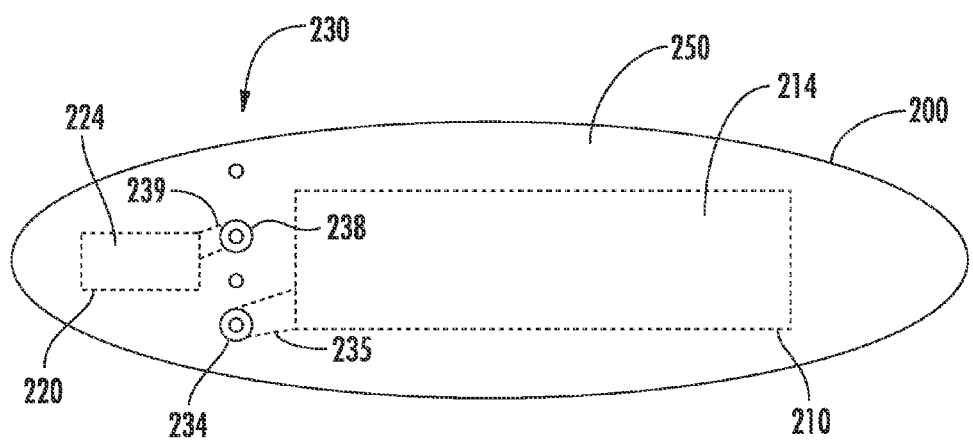
FIG. 5 depicts a plan view of a second surface of a substrate including a conductive terminal structure according to an exemplary embodiment of the present disclosure.

FIG. 5 depicts a plan view of the opposite surface of the substrate 200. As shown, the connection structure 230 includes a second conductive terminal 234 electrically coupled to the second conductive layer 214 of the piezoelectric component 210 via a suitable conductive trace 235. The second conductive terminal 234 includes a conductive annulus or other suitable conductive structure that is exposed to the bottom surface of the substrate 200 through the second insulating layer 250 of the substrate 200. In this way, the piezoelectric component 210 includes one conductive terminal 232 exposed through the first insulating layer 240 and another conductive terminal 234 exposed through the second insulating layer 250. No compression connections are required to couple the first conductive terminal 232 to the first conductive layer 212 of the piezoelectric component 210 or to couple the second conductive terminal 234 to the second conductive layer 214 of the piezoelectric component 210.

Referring back to FIG. 4, the connection structure 230 can further include a third conductive terminal 236 electrically coupled to the first conductive layer 222 of the second piezoelectric component 220 via a suitable conductive trace 237. The third conductive terminal 236 includes a conductive annulus or other suitable conductive structure that is exposed to the top surface of the substrate 200 through the first insulating layer 240.

As shown in FIG. 5, the connection structure 230 can also include a fourth conductive terminal 238 electrically coupled to the second conductive layer 224 of the piezoelectric component 220 via a suitable conductive trace 239. The fourth conductive terminal 238 includes a conductive annulus or other suitable conductive structure that is exposed to the bottom surface of the substrate 200 through the second insulating layer 250 of the substrate 200. In this way, the piezoelectric component 220 includes one conductive terminal 236 exposed through the first insulating layer 240 and another conductive terminal 238 exposed through the second insulating layer 250. Similar to the conductive terminals 232, 234 for the first piezoelectric component 210, no compression connections are required to couple the third conductive terminal 236 to the first conductive layer 222 of the piezoelectric component 220 or to couple the second conductive terminal 238 to the second conductive layer 224 of the piezoelectric component 220.

Figure 6:
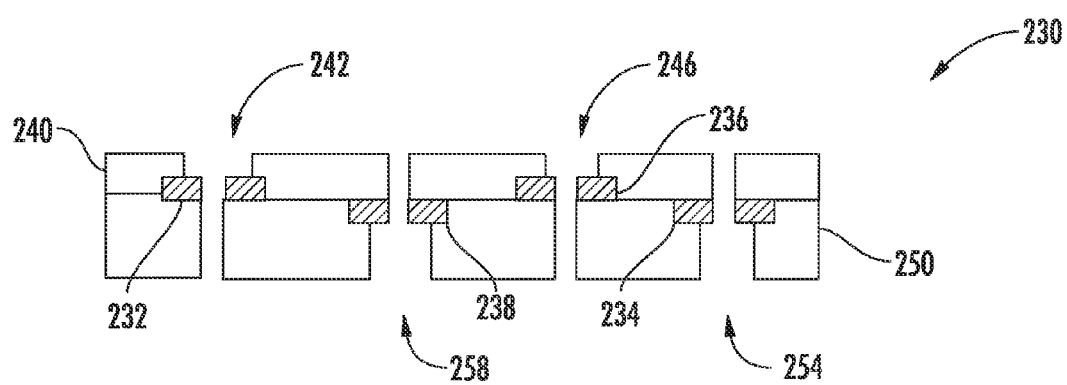
FIG. 6 depicts a cross-sectional view of a conductive terminal structure according to an exemplary embodiment of the present disclosure.

FIG. 6 depicts a cross-sectional view taken along line 6-6' of the connection structure 230 of the substrate 200 of FIG. 4. FIG. 6 illustrates that the conductive terminals 232 and 234 associated with the first piezoelectric component 210 are exposed on opposite sides of the substrate 200. In particular, conductive terminal 232 is exposed through the first insulating layer 240. The conductive terminal 234 is exposed through the second insulating layer 250. The conductive terminal 232 can be electrically coupled to a first conductive layer 212 of the piezoelectric component 210 (shown in FIG. 4). The conductive terminal 234 can be electrically coupled to a second conductive layer 214 of the piezoelectric component 210 (shown in FIG. 5). Referring to FIG. 6, the conductive terminal 232 includes a solder well 242 formed in the first insulating layer 240. The conductive terminal 234 includes a solder well 254 formed in the second insulating layer 250. The solder wells 234 and 254 can receive solder for providing a solder connection to an electrical connector.

FIG. 6 further illustrates that the conductive terminal 236 and 238 associated with the second piezoelectric component 220 are exposed on opposite sides of the substrate 200. In particular, conductive terminal 236 is exposed through the first insulating layer 240. The conductive terminal 238 is exposed through the second insulating layer 250. The conductive terminal 236 can be electrically coupled to a first conductive layer 222 of the piezoelectric component 220 (shown in FIG. 4). The conductive terminal 238 can be electrically coupled to a second conductive layer 224 of the piezoelectric component 220 (shown in FIG. 5). Similar to the conductive terminals 232 and 234, the conductive terminal 236 includes a solder well 246 formed in the first insulating layer 240. The conductive terminal 238 includes a solder well 258 formed in the second insulating layer 250. The solder wells 246 and 258 can receive solder for providing a solder connection to an electrical connector.

FIGS. 4-6 depict one exemplary configuration of a one up, one down configuration for an electrical connection structure providing connections to piezoelectric components 210 and 220. Those of ordinary skill in the art, using the disclosures provided herein, will understand that the exemplary connection structure can be modified in various ways without deviating from the scope of the present disclosure. For instance, the outer conductive terminals can be coupled to the signal piezoelectric component 210. The inner conductive terminals can be coupled to the generator piezoelectric component 220. Other suitable configurations are also possible.

Figure 7:
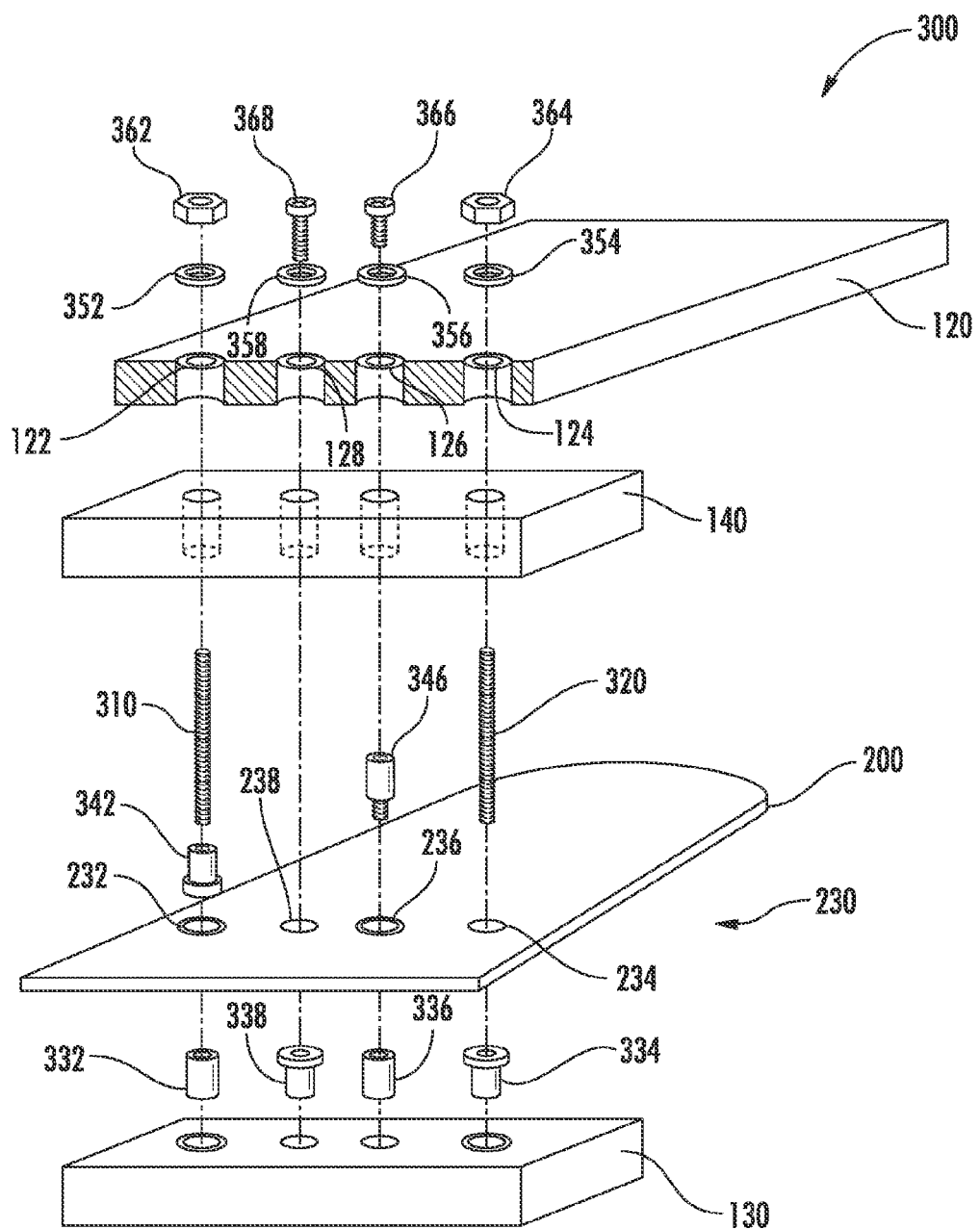
FIG. 7 depicts an exploded view of a tire mountable apparatus according to an exemplary embodiment of the present disclosure.

FIG. 7 depicts an exploded view of an exemplary connector assembly 300 for electrically and mechanically coupling the printed circuit board 120 to the electrical connection structure 230. As shown, the connector assembly 300 includes a first support bar 130 aligned with the connection structure 230. The first support bar 130 can have a degree of rigidity so as to provide mechanical support and protection for the conductor terminals 232, 234, 236, and 238 of the connection structure 230. The first support bar 130 can be formed from any insulating or non-conductive material, such as FR4.

The first support bar 130 can be bonded to the elastomeric patch 110 (shown in FIG. 2) through an adhesive, such as Chemlok® adhesive available from LORD Corporation. In another embodiment, the first support bar 130 can be formed of a hard rubber or other rigid material that is embedded, integral, or a part of the elastomeric patch 110. In this embodiment, no adhesive is necessary to bond the first support bar 130 to the elastomeric patch 110. The first support bar 130 can also include rounded or tapered edges so as to reduce the local concentration of stresses applied to the elastomeric patch 110 or to the substrate 200.

Referring back to FIG. 7, the connection assembly 300 can further include a second support bar 140. The second support bar 140 can be aligned with the connection structure 230 to protect the conductive terminals 232, 234, 236, and 238 of the connection structure 230. The second support bar 140 can also act as a spacer between the substrate 200 and the printed circuit board 120. The second support bar 140 can have a height sufficient to prevent the printed circuit board 120 from contacting the substrate 200 when subjected to mechanical stresses, such as during rotation of a tire. Similar to the first support bar 130, the second support bar 140 can be formed from an insulating or non-conductive material, such as FR4.

As shown in FIG. 7, the plurality of conductive terminals 232, 234, 236, and 238 are arranged between the first support bar 130 and the second support bar 140. The first support bar 130 and the second support bar 140 can work together to provide mechanical support and protection for the conductive terminals 232, 234, 236, and 238, including to protect the mechanical integrity of the solder interface at the conductive terminals 232, 234, 236, and 238. For instance, the first support bar 130 and the second support bar 140 can be compressed together to provide a compressive load on the conductive terminals 232, 234, 236 and 238 of the connection structure 230 to preserve electric contact with the conductive terminals 232, 234, 236, and 238 of the connection structure 230.

The printed circuit board 120 can be mechanically and electrically connected to the conductive terminals 232, 234, 236, and 238 of the connection structure 230 using conductive posts 310 and 320 and various electrical connectors. In particular, the first support bar 130 can include a plurality of threaded electrical connectors 332, 334, 336, and 338. The electrical connectors 332 and 336 can be non-flanged brass inserts. The electrical connectors 334 and 338 can be flanged brass inserts. The electrical connectors 334 and 338 can be soldered to the "down" conductive terminals 234 and 238 of the connection structure 230 to provide an electrical connection between the conductive terminals 234, 238 and the electrical connectors 334, 338.

The connector assembly 300 can also include threaded electrical connectors 342 and 346 that are coupled to the "up" conductive terminals 232 and 236. The electrical connectors 342 and 346 can be soldered to the "up" conductive terminals 232 and 236 of the connection structure 230 to provide an electrical connection between the conductive terminals 232, 236 and the electrical connectors 342, 346. The electrical connector 342 can be a flanged brass insert. In one implementation, the electrical connector 342 can be aligned with the electrical connector 332 to match threads between the electrical connector 342 and the electrical connector 332. The electrical connector 346 can be a threaded stand-off that is threaded into the electrical connector 336.

The conductive posts 310 and 320 can be arranged in the connector assembly 300 to provide a mechanical and electrical connection between the printed circuit board 120 and the connection structure 230. The conductive posts 310 and 320 can be formed from any suitable conductive material such as stainless steel. The conductive posts 310 and 320 can include threads for connecting to threaded electrical connectors.

The conductive post 310 can be electrically coupled to the electrical connector 332 in the first support bar 130 and can be arranged to extend from the first support bar 130 through the conductive terminal 232 and electrical connector 342 and through the second support bar 140. The conductive post 310 can then be electrically and mechanically coupled to the printed circuit board 120 using a nut 362 and an optional washer 352 arrangement. In particular, the nut 362 and optional washer 352 arrangement can be tightened to provide an electrical connection between the conductive post 310 and a conductive terminal 122 on the printed circuit board 120.

The conductive post 320 can be electrically coupled to the electrical connector 334 in the first support bar 130 and can be arranged to extend from the first support bar 130 through the conductive terminal 234 and through the second support bar 140. The conductive post 320 can then be electrically and mechanically coupled to the printed circuit board 120 using a nut 364 and optional washer 354 arrangement. In particular, the nut 364 and optional washer 354 arrangement can be tightened to provide an electrical connection between the conductive post 320 and a conductive terminal 124 on the printed circuit board 120.

The conductive post 310 and the conductive post 320, together, can provide an electrical connection between the printed circuit board 120 and the first piezoelectric component 210 of the substrate 200 via conductive terminals 232 and 234. The conductive posts 310 and 320 also act to provide a mechanical connection between the printed circuit board 120 and the substrate 200 and can serve to provide a compressive load on the connection structure 230 by compressing the first support bar 130 and the second support bar 140.

The printed circuit board 120 can also be electrically coupled to second piezoelectric component 220 of the substrate via electrical connectors 366 and 368. In particular, electrical connectors 366 and 368 can be coupled, using optional washers 356 and 358 to conductive terminals on the printed circuit board 120. The electrical connectors 366 and 368 can be conductive screws. The electrical connector 366 can extend through optional washer 356, a conductive terminal 126 of the printed circuit board 120, and the second support bar 140 and be threaded into the stand-off electrical connector 346 so as to provide an electrical connection between a conductive terminal 126 of the printed circuit board 120 and the conductive terminal 236.

The electrical connector 368 can extend through optional washer 358, a conductive terminal 128 of the printed circuit board 120, the second support bar 140, the conductive terminal 138 and into the electrical connector 338 to provide an electrical connection between a conductive terminal 128 of the printed circuit board 120 and the conductive terminal 238. Other suitable electrical connectors can be used in the connector assembly to electrically couple the printed circuit board 120 to the connection structure 230 without deviating from the scope of the present disclosure.

Figure 8:
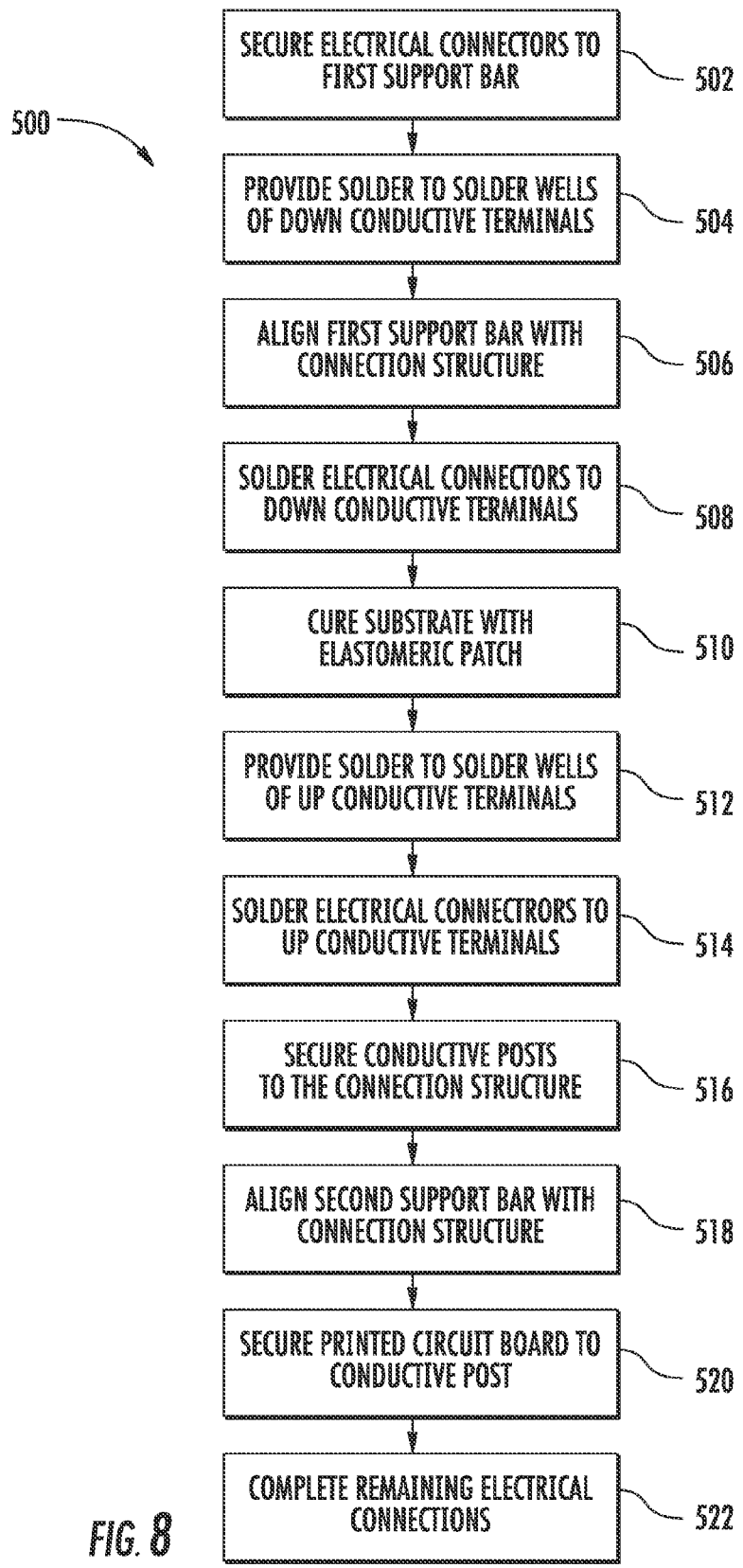
FIG. 8 depicts a flow diagram of an exemplary method according to an exemplary embodiment of the present disclosure.

FIG. 8 depicts a flow diagram of an exemplary method (500) of manufacturing a tire mountable apparatus according to an exemplary embodiment of the present disclosure. Although FIG. 8 depicts steps performed in a particular order for purposes of illustration and discussion, the methods discussed herein are not limited to any particular order or arrangement. One skilled in the art, using the disclosures provided herein, will appreciate that various steps of the methods can be omitted, rearranged, combined and/or adapted in various ways.

At (502), the method includes securing electrical connectors to the first support bar. For instance, the electrical connectors 332, 334, 336, and 338 of FIG. 7 can be pressed into the support bar 130. At (504), the method includes providing solder to the solder wells associated with the "down" conductive terminals of the substrate. For instance, solder can be provided to the solder wells 254 and 258 (shown in FIG. 5) associated with down conductive terminals 234 and 238 that are defined in the second insulating layer 250 of the substrate 200.

At (506) of FIG. 8, the first support bar is aligned with the connection structure of the substrate. For instance, the first support bar 130 of FIG. 7 with electrical connectors 332, 334, 336, and 338 is aligned with the connection structure 230 of the substrate 200 such that the electrical connectors 332, 334, 336, and 338 are aligned with the conductive terminals 232, 234, 236, and 238 of the connection structure 230. At (508) of FIG. 9, electrical connectors are soldered to the down conductive terminals. For instance, the flanged electrical connectors 334 and 338 are soldered to the down conductive terminals 234 and 238 of the connection structure 230 of the substrate 200.

At (510) of FIG. 8, the method includes curing the substrate to an elastomeric patch. For instance, as shown in FIG. 1, the substrate 200, including the first support bar 130, can be cured with the elastomeric patch 110 to secure the substrate 200 and first support bar 130 to the mesa portion 114 of the elastomeric patch 110. The first support bar 130 can be embedded in the elastomeric member 110. In one example, the substrate 200 can be secured to the elastomeric patch 110 by coating an adhesive on the substrate 200, placing the substrate 200 in a specially designed mold design to accommodate the substrate 200, filling the remainder of the mold with the elastomeric material such as rubber, and curing the patch 110.

At (512) of FIG. 8, the method includes providing solder to the solder wells associated with the "up" conductive terminals of the substrate. For instance, solder can be provided to the solder wells 242 and 246 (shown in FIG. 5) associated with the up conductive terminals 232 and 236 that are defined in the first insulating layer 240 of the substrate 200. At (514) of FIG. 8, electrical connectors are soldered to the up conductive terminals of the substrate. For instance, the electrical connectors 342 and 346 of FIG. 7 can be soldered to the up conductive terminals 232 and 236.

At (516) of FIG. 8, the method includes securing conductive posts to the connection structure. For instance, the conductive post 310 of FIG. 7 can be secured to the electrical connectors 332 and 342 and the conductive terminal 232. The conductive post 320 can be secured to the electrical connector 334 and the conductive terminal 234.

At (518) of FIG. 8, the second support bar is aligned with the connection structure. For instance, the second support bar 140 of FIG. 7 is positioned over the connection structure 130 such that conductive posts 310 and 320 and electrical connector 346 extend at least partially through the second support bar 140. At (520) of FIG. 8, the printed circuit board is secured to the conductive posts. For instance, the printed circuit board 120 of FIG. 7 is secured to the conductive post 310 using nut 362 and optional washer 352 such that the conductive post 310 is in electrical communication with the conductive terminal 122 of the printed circuit board 120. The circuit board 120 is also secured to the conductive post 320 using nut 364 and optional washer 354 such that the conductive post 320 is in electrical communication with the conductive terminal 124 of the printed circuit board 120.

At (522) of FIG. 8, any remaining electrical connections between the substrate and the printed circuit board are completed. For instance, the electrical connector 366 of FIG. 7 is threaded through optional washer 356 and conductive terminal 126 of the printed circuit board 120 and into stand-off electrical connector 346. The electrical connector 368 is threaded through optional washer 358, conductive terminal 128 of printed circuit board, conductive terminal 238 of the connection structure 230, and the electrical connector 338.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art using the teachings disclosed herein.

What is claimed is:

1. A tire mountable apparatus comprising a substrate, the substrate comprising:
a first piezoelectric component arranged between a first insulating layer of the substrate and a second insulating layer of the substrate, the first piezoelectric component comprising first and second conductive layers and a first piezoelectric layer arranged between the first and second conductive layers;
a conductive terminal structure, the conductive terminal structure comprising a plurality of conductive terminals, the plurality of conductive terminals comprising a first conductive terminal electrically coupled to the first conductive layer and a second conductive terminal electrically coupled to the second conductive layer;
wherein the first conductive terminal is exposed through the first insulating layer of the substrate, the second conductive terminal is exposed through the second insulating layer of the substrate, and the first conductive terminal and the second conductive terminal are alternately exposed with respect to each other.

2. The tire mountable apparatus of claim 1, wherein the first conductive terminal comprises a first solder well formed in the first insulating layer and the second conductive terminal comprises a second solder well formed in the second insulating layer.

3. The tire mountable apparatus of claim 1, wherein the substrate comprises a second piezoelectric component arranged between the first insulating layer and the second insulating layer, the second piezoelectric component comprising third and fourth conductive layers and a second piezoelectric layer arranged between the third and fourth conductive layers.

4. The tire mountable apparatus of claim 3, wherein the plurality of conductive terminals comprises a third conductive terminal electrically coupled to the third conductive layer and a fourth conductive terminal electrically coupled to the fourth conductive layer, the third conductive terminal exposed through the first insulating layer of the substrate and the fourth conductive terminal exposed through the second insulating layer of the substrate, the third conductive terminal and the second conductive terminal alternately exposed with respect to each other.

5. The tire mountable apparatus of claim 4, wherein the plurality of conductive terminals are arranged in a generally linear relationship.

6. The tire mountable apparatus of claim 4, wherein the third conductive terminal comprises a third solder well formed in the first insulating layer and the fourth conductive terminal comprises a fourth solder well formed in the second insulating layer.

7. The tire mountable apparatus of claim 1, wherein the plurality of conductive terminals each comprise a conductive annulus.

8. The tire mountable apparatus of claim 1, wherein the first and second insulating layers are formed from FR4.

9. The tire mountable apparatus of claim 1, wherein the tire mountable apparatus further comprises an elastomeric layer having a base portion and a mesa portion, the substrate being secured to the mesa portion of the elastomeric layer.

10. The tire mountable apparatus of claim 1, wherein the tire mountable apparatus comprises a first support bar and a second support bar, the plurality of conductive terminals being arranged between the first support bar and the second support bar.

11. The tire mountable apparatus of claim 10, wherein the tire mountable apparatus further comprises a printed circuit board electrically and mechanically coupled to the plurality of conductive terminals.

12. The tire mountable apparatus of claim 11, wherein the printed circuit board is coupled to the piezoelectric component through the first and second conductive terminals using a plurality of conductive posts, each of the plurality of conductive posts extending from the first support bar and through one of the first and second conductive terminals, each of the plurality of conductive posts further extending through the second conductive element and being operably connected to the printed circuit board so as to provide an electrical connection between the printed circuit board and one of the first and second conductive terminals and so as to provide mechanical support for the printed circuit board.

13. The tire mountable apparatus of claim 11, wherein the printed circuit board is coupled to the second piezoelectric component through a plurality of electrical connectors, each of the plurality of electrical connectors extending through the second support bar and contacting one of the third conductive terminal or the fourth conductive terminal so as to provide an electrical connection between the printed circuit board and one of the third and fourth conductive terminals.

14. The tire mountable apparatus of claim 1, wherein the first insulating layer and the second insulating layer have different thicknesses.

15. A method of manufacturing a tire mountable apparatus, comprising:
   aligning a first support bar with a plurality of conductive terminals formed in a substrate, the substrate comprising a piezoelectric component arranged between a first insulating layer and a second insulating layer, the piezoelectric component comprising first and second conductive layers and a piezoelectric layer arranged between the first and second conductive layers, the plurality of conductive terminals comprising a first conductive terminal and a second conductive terminal, the first conductive terminal electrically coupled to the first conductive layer and exposed through the first insulating layer of the substrate, the second conductive terminal electrically coupled to the second conductive layer and exposed through the second insulating layer of the substrate, the first conductive terminal and the second conductive terminal alternately exposed with respect to each other;
   providing solder in a second solder well formed in the second insulating layer of the substrate, the second solder well associated with the second conductive terminal; and
   soldering an electrical connector located in the first support bar with the second conductive terminal.

16. The method of claim 15, wherein the method further comprises curing the substrate to an elastomeric member, the elastomeric member comprising a base portion and a mesa portion, the substrate being secured to the mesa portion of the elastomeric member such that the first support bar is embedded in the elastomeric member.

17. The method of claim 15, wherein the method further comprises:
   providing solder in a first solder well formed in the first insulating layer of the substrate, the first solder well associated with the first conductive terminal; and
   soldering an electrical connector with the first conductive terminal.

18. The method of claim 17, wherein the method further comprises:
   securing a first conductive post to the electrical connector soldered to the first conductive terminal; and
   securing a second conductive post to the electrical connector soldered to the second conductive terminal.

19. The method of claim 18, wherein the method comprises positioning a second support bar over the plurality of conductive terminals such that the first and second conductive posts extend through the second support bar.

20. The method of claim 19, wherein the method comprises securing a printed circuit board to the first and second conductive posts such that the printed circuit board is electrically connected to the first and second conductive terminals and such that the printed circuit board is mechanically supported by the first and second conductive posts.

* * * * *